(12) United States Patent
Chen et al.

(10) Patent No.: US 10,411,657 B2
(45) Date of Patent: Sep. 10, 2019

(54) TWO-STAGE ELECTROMAGNETIC INDUCTION TRANSFORMER

(71) Applicant: RichWave Technology Corp., Taipei (TW)

(72) Inventors: Chih-Sheng Chen, Taipei (TW); Chang-Yi Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/264,701

(22) Filed: Feb. 1, 2019

(65) Prior Publication Data
US 2019/0165743 A1 May 30, 2019

Related U.S. Application Data

(62) Division of application No. 14/886,109, filed on Oct. 19, 2015, now Pat. No. 10,270,401.

(30) Foreign Application Priority Data

Oct. 20, 2014 (TW) .............................. 103136202 A
May 4, 2015 (TW) .............................. 104114108 A

(51) Int. Cl.
*H01F 5/00* (2006.01)
*H03F 1/56* (2006.01)
(Continued)

(52) U.S. Cl.
CPC ......... *H03F 1/565* (2013.01); *H01F 27/2804* (2013.01); *H03F 3/195* (2013.01);
(Continued)

(58) Field of Classification Search
USPC ........................................ 336/200, 223, 232
See application file for complete search history.

(56) References Cited

U.S. PATENT DOCUMENTS 5,264,810 A * 11/1993 Sager ....................... H03H 7/48
330/124 D
5,331,271 A 7/1994 Thuis
(Continued)

FOREIGN PATENT DOCUMENTS

CN 101488729 A 7/2009
CN 101753108 A 6/2010
(Continued)

*Primary Examiner* — Ronald Hinson
(74) *Attorney, Agent, or Firm* — Winston Hsu

(57) ABSTRACT

A transformer has a first winding, a second winding, a third winding, a fourth winding and a fifth winding. The fifth winding has a first part and a second part serially connected to the first part. The first part is magnetically coupled to the second winding and magnetically isolated from the first winding, and the second part is magnetically coupled to the fourth winding and magnetically isolated from the third winding. The second winding is positioned between the first winding and the first part, the first winding is positioned adjacent to the second winding, and the second winding is positioned adjacent to the first part. The fourth winding is positioned between the third winding and the second part, the third winding is positioned adjacent to the fourth winding, and the fourth winding is positioned adjacent to the second part.

12 Claims, 12 Drawing Sheets

(51) Int. Cl.
*H03F 3/195* (2006.01)
*H03F 3/21* (2006.01)
*H03F 3/45* (2006.01)
*H01F 27/28* (2006.01)
*H01F 19/08* (2006.01)

(52) U.S. Cl.
CPC ......... *H03F 3/211* (2013.01); *H03F 3/45475* (2013.01); *H01F 2019/085* (2013.01); *H01F 2027/2809* (2013.01); *H03F 2200/387* (2013.01); *H03F 2200/451* (2013.01); *H03F 2200/537* (2013.01); *H03F 2200/541* (2013.01); *H03F 2203/45731* (2013.01)

(56) References Cited

U.S. PATENT DOCUMENTS

| | | | |
|---|---|---|---|
| 5,898,251 A | 4/1999 | Mochizuki | |
| 7,289,338 B2 * | 10/2007 | Kawasaki | H02M 3/33592 363/131 |
| 7,545,059 B2 | 6/2009 | Chen | |
| 7,616,934 B2 | 11/2009 | Macphail | |
| 7,728,661 B2 * | 6/2010 | Bockelman | H03F 1/0277 330/124 R |
| 7,755,452 B2 * | 7/2010 | Knickerbocker | H01P 5/16 330/124 R |
| 7,894,223 B2 | 2/2011 | Sato | |
| 8,044,540 B2 | 10/2011 | Lee | |
| 8,098,095 B2 * | 1/2012 | Nam | H03F 3/68 330/195 |
| 8,666,340 B2 * | 3/2014 | Rofougaran | H01L 23/49822 455/127.3 |
| 8,674,764 B2 * | 3/2014 | Kondo | H03F 1/0277 330/165 |
| 9,859,852 B2 * | 1/2018 | Anderson | H03F 1/0227 |
| 2008/0139131 A1 * | 6/2008 | Macphail | H03F 1/02 455/90.2 |
| 2008/0197963 A1 | 8/2008 | Muto | |
| 2011/0117860 A1 * | 5/2011 | Kimball | H03F 1/565 455/73 |
| 2011/0222443 A1 | 9/2011 | Khlat | |
| 2011/0316624 A1 | 12/2011 | Kimball | |
| 2012/0146741 A1 * | 6/2012 | Yen | H01L 23/5223 333/25 |
| 2015/0214896 A1 * | 7/2015 | Xu | H03F 1/0277 330/251 |
| 2015/0302976 A1 | 10/2015 | Chang | |

FOREIGN PATENT DOCUMENTS

| | | |
|---|---|---|
| CN | 101996753 A | 3/2011 |
| CN | 102868419 A | 1/2013 |
| CN | 103377809 A | 10/2013 |
| CN | 203406835 U | 1/2014 |
| JP | S4848136 U | 6/1973 |
| JP | 11-124276 A | 5/1999 |
| TW | 516213 | 1/2003 |
| TW | 200511620 | 3/2005 |
| TW | I300575 | 9/2008 |
| TW | 201342402 A | 10/2013 |
| TW | 201342818 A | 10/2013 |
| TW | 201430874 | 8/2014 |
| WO | 0178091 A1 | 10/2001 |

* cited by examiner

TWO-STAGE ELECTROMAGNETIC INDUCTION TRANSFORMER

CROSS REFERENCE TO RELATED APPLICATION

This patent application is a divisional application of and claims priority to U.S. patent application Ser. No. 14/886,109, filed on Oct. 19, 2015, and entitled "TWO-STAGE ELECTROMAGNETIC INDUCTION TRANSFORMER". Patent application Ser. No. 14/886,109 claims the benefit of Taiwan Patent Application No. 103136202 filed on Oct. 20, 2014 and Taiwan Patent Application No. 104114108 filed on May 4, 2015. The entire contents of which are incorporated herein by reference.

TECHNICAL FIELD

The technical field relates to a transformer, and more particularly, to a two-stage electromagnetic induction transformer.

BACKGROUND

Transformers have been popularly used in many electric or power apparatuses to pull up/down voltages or provide impedance matching. Basically, the impedance matching would be adjusted according to equipment requirement (e.g. gain, efficiency, power, signal-to-noise ratio (SNR), etc.). For instance, in order to optimize the power delivered from a signal source to a load circuit, an impedance ratio of the transformer may be adjusted, such that the output impedance of the signal source would match the impedance of the load circuit.

In the field of impedance matching, a lot of techniques have been disclosed. For example, Macphail disclosed "Switched impedance transformer for semiconductor circuits" in U.S. Pat. No. 7,616,934. Lee et al. disclosed "Systems and methods for a SPDT switch or SPMT switch with transformer" in U.S. Pat. No. 8,044,540.

SUMMARY

An embodiment of the present invention provides a transformer. The transformer comprises a first winding, a second winding and a third winding. The first winding is configured to receive a first input signal to generate a first signal. The second winding is magnetically coupled to the first winding and configured to generate a second signal through electromagnetic induction with the first winding or by receiving a second input signal. The third winding is magnetically coupled to the second winding, magnetically isolated from the first winding, and configured to electromagnetically induct with the second winding and output an output signal. The second winding is positioned between the first winding and the third winding, the first winding is positioned adjacent to the second winding, and the second winding is positioned adjacent to the third winding.

Another embodiment of the present invention provides a transformer. The transformer comprises a first winding, a second winding, a third winding, a fourth winding and a fifth winding. The fifth winding has a first part and a second part serially connected to the first part. The first part is magnetically coupled to the second winding and magnetically isolated from the first winding, and the second part is magnetically coupled to the fourth winding and magnetically isolated from the third winding. The second winding is posited between the first winding and the first part, the first winding is posited adjacent to the second winding, and the second winding is posited adjacent to the first part. The fourth winding is posited between the third winding and the second part, the third winding is posited adjacent to the fourth winding, and the fourth winding is posited adjacent to the second part.

DETAILED DESCRIPTION

Figure 1:
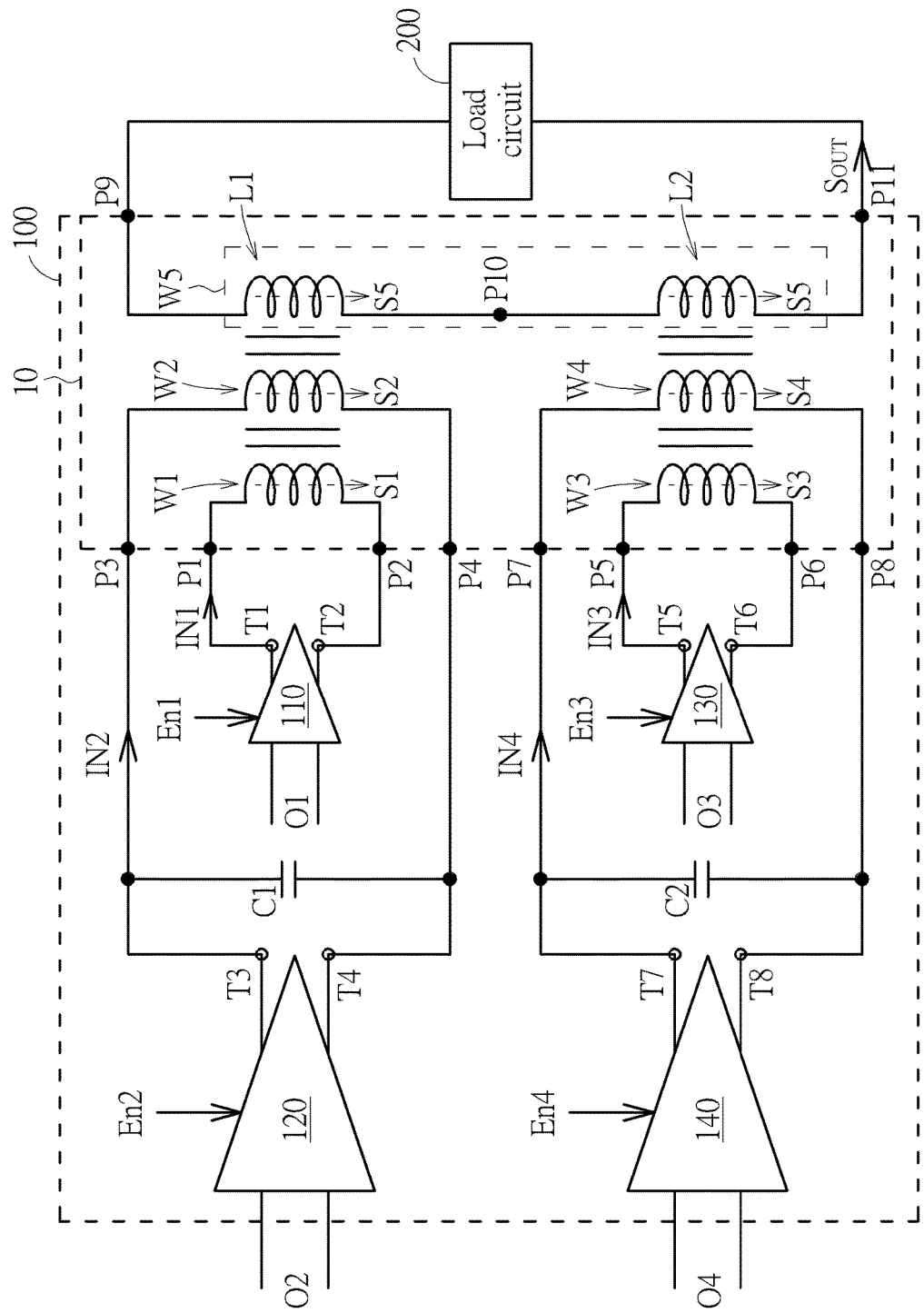
FIG. 1 is a circuit diagram of radio frequency amplifier according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please refer to FIG. 1. FIG. 1 is a circuit diagram of radio frequency (RF) amplifier 100 according to an embodiment of the present invention. The RF amplifier 100 is coupled to a load circuit 200 and comprises four amplifiers 110-140 and a transformer 10. The transformer 10 comprises windings W1 to W5. The winding W5 comprise a first part L1 and a second part L2. The first part L1 and the second part L2 are connected in serial. The winding W1 is configured to receive an input signal IN1 and generate a signal S1. The winding W2 is magnetically coupled to the winding W1 and is configured to generate a signal S2 through electromagnetic induction with the winding W1 and/or by receiving an input signal IN2. The winding W3 is configured to receive an input signal IN3 and generate a signal S3. The winding W4 is magnetically coupled to the winding W3 and is configured to generate a signal S4 through electromagnetic induction with the winding W3 and/or by receiving an input signal IN4. The first part L1 is magnetically coupled to the winding W2 and magnetically isolated from the winding W1, and the second part L2 is magnetically coupled to the winding W4 and magnetically isolated from the winding W3. The first part L1 and the second part L2 of the fifth winding W5 are configured to generate a signal S5 respectively through electromagnetic induction with the winding W2 and the winding W4, and to output an output signal $S_{OUT}$ from an end P11 of the second part L2. The winding W2 is positioned between the winding W1 and the first part L1, and the winding W4 is positioned between the winding W3 and the second part L2. The winding W1 is positioned adjacent to the winding W2, the winding W2 is positioned adjacent to the first part L1, the winding W3 is positioned adjacent to the winding W4, and the winding W4 is positioned adjacent to the part second L2. In the below description, it would explain how to electromagnetically isolate the first part L1 from the winding W1 and how to electromagnetically isolate the second part L1 from the winding W3. Moreover, when the input signal IN1 is inputted to the winding W1, the winding W1 generates the signal S1. The signal S2 generated by the winding W2 may be resulted from inputting the input signal IN2 to the winding W2, electromagnetic induction with the first winding W1, or both inputting the input signal IN2 to the winding W2 and the electromagnetic induction with the first winding W1. Similarly, when the input signal IN3 is inputted to the winding W3, the winding W3 generates the signal S3. The signal S4 generated by the winding W4 may be resulted from inputting the input signal IN4 to the winding W4, electromagnetic induction with the first winding W3, or both inputting the input signal IN4 to the winding W4 and the electromagnetic induction with the first winding W3.

The amplifiers 110, 120, 130 and/or 140 may be high-frequency amplifiers or power amplifiers in view of their functions. In view of the numbers of input/output ends of the amplifiers 110 to 140, the amplifiers 110, 120, 130 and/or 140 may be single-ended amplifiers or differential amplifiers. However, the present invention is not limited thereto. In the embodiment, the amplifiers 110 to 140 are differential amplifiers. Input ends of the amplifiers 110, 120, 130 and 140 are coupled to a signal sources O1, O2, O3 and O4 respectively. The amplifiers 110, 120, 130 and 140 respectively amplify signals outputted from the signal sources O1, O2, O3 and O4 to output the input signals IN1, IN2, IN3 and IN4 according to enable signals En1, En2, En3 and En4. Output end T1, T3, T5 and T7 of the amplifiers 110, 120, 130 and 140 are respectively coupled to ends P1, P3, P5 and P7 of the windings W1, W2, W3 and W4, and the input signals IN1, IN2, IN3 and IN4 are respectively inputted to the windings W1, W2, W3 and W4 through the ends P1, P3, P5 and P7 of the windings W1, W2, W3 and W4. Moreover, the amplifiers 110, 120, 130 and 140 respectively further comprise output ends T2, T4, T6 and T8 respectively, which are coupled to the ends P2, P4, P6 and P8 of the windings W1, W2, W3 and W4.

In the embodiment, the amplifier 110 is activated by an enable signal En1 so as to output the input signal IN1 to the winding W1. Similarly, the amplifier 120 is activated by an enable signal En2 so as to output the input signal IN2 to the winding W2; the amplifier 130 is activated by an enable signal En3 so as to output the input signal IN3 to the winding W3; and the amplifier 140 is activated by an enable signal En4 so as to output the input signal IN4 to the winding W4. It is noted that the power of the signal S2 generated by the winding W2 would be changed when the amplifier 120 is activated by an enable signal En2, and that the power of the signal S4 generated by the winding W4 would be changed when the amplifier 140 is activated by an enable signal En4. The enable signals En1, En2, En3 and En4 may be the power supply signals of the amplifiers 110, 120, 130 and 140, control signals of a bias circuit, system voltages (VDD or VCC) of the radio frequency amplifier 110 or bias voltages of the radio frequency amplifier 110.

Moreover, the impedance matching of the radio frequency amplifier 110 could be adjusted by enabling/disabling the amplifiers 110, 120, 130 and/or 140. In detail, the impedance matching provided by the transformer 10 could be switched among a first impedance matching, a second impedance matching, a third impedance matching and a fourth impedance matching based on the enable signals En1, En2, En3 and En4. When one of the input signals IN1 and IN3 is inputted, and the input signals IN2 and IN4 and another of the input signals IN1 and IN3 are not inputted, the transformer 10 provides the first impedance matching. For example, when the amplifier 110 is enabled and the amplifiers 120, 130 and 140 are disabled, the transformer 10 provides the first impedance matching by performing a two-stage electromagnetic induction which comprises the electromagnetic induction between the windings W1 and W2 resulted from inputting the signal IN1 and the electromagnetic induction between the winding W2 and the first part L1 which results in the generation of the signal S5. Moreover, when the input signals IN1 and IN3 are inputted, and the input signals IN2 and IN4 are not inputted, the transformer 10 provides the second impedance matching. That is, when the amplifiers 110 and 130 are enabled and the amplifiers 120 and 140 are disabled, the transformer 10 provides the second impedance matching. Further, when one of the input signals IN2 and IN4 is inputted, and the input signals IN1 and IN3 and another of the input signals IN2 and IN4 are not inputted, the transformer 10 provides the third impedance matching. For example, when the amplifier 120 is enabled and the amplifiers 110, 130 and 140 are disabled, the transformer 10 provides the third impedance matching by performing electromagnetic induction between the winding W2 and the first part L1 to generate which results in the generation of the signal S5. In addition, when the input signals IN2 and IN4 are inputted, and the input signals IN1 and IN3 are not inputted, the transformer 10 provides the fourth impedance matching. That is, when the amplifiers 120 and 140 are enabled and the amplifiers 110 and 130 are disabled, the transformer 10 provides the fourth impedance matching. Furthermore, the transformer 10 may provide a fifth impedance matching by enabling the amplifiers 110, 120, 130 and 140. Accordingly, the impedance matching provided by the transformer 10 could be switched among the first impedance matching, the second impedance matching, the third impedance matching, the fourth impedance matching and the fifth impedance matching.

In an embodiment the transformer ratios of the windings W1, W2 and the first part L1 is 4:2:1, the transformer ratios of the windings W3-W4 and the second part L2 is 4:2:1, the inductances of the windings W1 and W3 are the same, the inductances of the windings W2 and W4 are the same, the inductances of the first part L1 and the second part L2 are the same, and the load impedance of the load circuit 200 is 50Ω. Therefore, the first impedance matching is equal to 50×4=200Ω, the second impedance matching is equal to 50/4=12.5Ω, the third impedance matching is equal to 50×2=100Ω, the fourth impedance matching is equal to 50/2×2=50Ω, and a typical value (i.e., an equivalent value which is regarded that the second impedance matching and the fourth impedance matching are connected in parallel) of fifth impedance matching is equal to $$\frac{(100\times 50)}{(100+50)} = 33.3\,\Omega.$$

Thus, the typical value of the fifth impedance matching is less than or equal to the fourth impedance matching, the fourth impedance matching is less than or equal to the third impedance matching, the third impedance matching is less than or equal to the second impedance matching, and the second impedance matching is less than or equal to the first impedance matching.

Moreover, the operation of inputting the input signal IN1 to the winding W1 is performed according to the enable signal En1, the operation of inputting the input signal IN2 to the winding W2 is performed according to the enable signal En2, the operation of inputting the input signal IN3 to the winding W3 is performed according to the enable signal En3, and the operation of inputting the input signal IN4 to the winding W4 is performed according to the enable signal En4. Therefore, the transformer 10 may provide the first impedance matching by inputting the input signal IN1 to the winding W1, such that the load impedance of the output signal $S_{OUT}$ matches the input signal IN1. Moreover, the transformer 10 may provide the second impedance matching by inputting the input signals IN1 and IN2 to the windings W1 and W3, such that the load impedance of the output signal $S_{OUT}$ matches the input signals IN1 and IN3. In addition, the transformer 10 may provide the third impedance matching by inputting the input signal IN2 to the winding W2, such that the load impedance of the output signal $S_{OUT}$ matches the input signal IN2. Further, the transformer 10 may provide the fourth impedance matching by inputting the input signals IN2 and IN4 to the windings W2 and W4, such that the load impedance of the output signal $S_{OUT}$ matches the input signals IN2 and IN4. Therefore, by inputting the input signals IN1, IN2, IN3 and/or IN4, the impedance matching provided by the transformer 10 would be switched among the first impedance matching, the second impedance matching, the third impedance matching and the fourth impedance matching. Wherein, the transformer 10 provides the first impedance matching when the input signal IN1 is inputted and the input signals IN2, IN3 and IN4 are not inputted. The transformer 10 provides the second impedance matching when the input signals IN1 and IN3 are inputted and the input signals IN2 and IN4 are not inputted. The transformer 10 provides the third impedance matching when the input signal IN2 is inputted and the input signals IN1, IN3 and IN4 are not inputted. The transformer 10 provides the fourth impedance matching when the input signals IN2 and IN4 are inputted and the input signals IN1 and IN3 are not inputted. Moreover, when the input signals IN1, In2, IN3 and IN4 are respectively inputted to the windings W1, W2, W3 and W4 of the transformer 10, the transformer 10 provides the fifth impedance matching.

Moreover, the output power of the RF amplifier 100 could be adjusted according to the enable signals En1, En2, En3 and En4. In an embodiment of the present invention, it is supposed that the output power of the RF amplifier 100 is equal to PW1 when the amplifier 110 is enabled and the amplifiers 120, 130 and 140 are disabled, that the output power of the RF amplifier 100 is equal to PW2 when the amplifiers 110 and 130 are enabled and the amplifiers 120 and 140 are disabled, that the output power of the RF amplifier 100 is equal to PW3 when the amplifier 120 is enabled and the amplifiers 110, 130 and 140 are disabled, and that the output power of the RF amplifier 100 is equal to PW4 when the amplifiers 120 and 140 are enabled and the amplifiers 110 and 130 are disabled. In the embodiment, the output power of the amplifier 120 is greater than that of the amplifier 110, and the output power of the amplifier 140 is greater than that of the amplifier 130, then PW4>PW3>PW2>PW1 and the output power of the RF amplifier 100 is substantially equal to (PW2+PW4) when all of the amplifiers 110, 120, 130 and 140 are enabled and the energy losses are ignored. Therefore, the output power of the RF amplifier 100 could be switched to 0, PW1, PW2, PW3, PW4 or (PW2+PW4) according to the enable signals En1, En2, En3 and En4. Accordingly, various demands for the output power of the RF amplifier 100 would be satisfied.

In an embodiment of the present invention, it is supposed that the winding W1 has an equivalent inductance I1, the winding W2 has an equivalent inductance I2 and the first part L1 has an equivalent inductance I5. The equivalent inductances I1, I2 and I5 are sequentially increasing or decreasing, and such relationships among the equivalent inductances I1, I2 and I5 may be determined according to the practical demands of the application of the circuit (e.g. gain, efficiency, power, SNR, etc.). In other words, relationships among the equivalent inductances I1, I2 and I5 may be I1>I2>I5 or I1<I2<I5. The equivalent inductances I1, I2 and I5 would be determined by adjusting the turns or widths of the windings W1, W2 and the first part L1. Take adjusting the turns of the windings W1, W2 and the first part L1 for example, if I1>I2>I5, a number of turns of the winding W1 is greater than a number of turns of the winding W2, and the number of turns of the winding W2 is greater than a number of turns of the first part L1. Take adjusting the widths of the windings W1, W2 and the first part L1 for example, if I1>I2>I5, the width of the winding W1 is less than the width of the winding W2, and the width of the winding W2 is less than the width of the first part L1. Similarly, it is supposed that the winding W3 has an equivalent inductance I3, the winding W4 has an equivalent inductance I5 and the second part L2 has an equivalent inductance I6. The equivalent inductances I3, I4 and I6 may be sequentially increasing or decreasing. In other words, relationships among the equivalent inductances I3, I4 and I6 may be I3>I4>I6 or I3<I4<I6. The equivalent inductances I3, I4 and I6 would be determined by adjusting the turns or widths of the windings W3-W4 and the first part L2.

In an embodiment of the present invention, I1<I2<I5, I3<I4<I6, the output power of the amplifier 120 is less than the output power of the amplifier 110, and the output power of the amplifier 140 is less than the output power of the amplifier 130. For example, if the ratios of I1:I2:I5 are 1:2:4 and the ratios of I3:I4:I6 are 1:2:4, then the transformer ratios of the windings W1, W2 and first part L1 would be 1:2:4 and the transformer ratios of the windings W3, W4 and second part L2 would be also 1:2:4. If the load impedance of the load circuit 200 is 400Ω, the first impedance matching is equal to 400/4=100Ω, the second impedance matching is equal to 400/2×¼=50Ω, the third impedance matching is equal to 400×²⁄₄=200Ω, and the fourth impedance matching is equal to 400×²⁄₄=100Ω. Thus, the second impedance matching is less than or equal to the first impedance matching, the first impedance matching is less than or equal to the fourth impedance matching, and the fourth impedance matching is less than or equal to the third impedance matching. In another embodiment of the present invention, the output power of the amplifier 120 is greater than the output power of the amplifier 110, and the output power of the amplifier 140 is greater than the output power of the amplifier 130, such that I1>I2>I5 and I3>I4>I6.

Since the transformer 10 outputs the signal S5 by performing the two-stage electromagnetic induction by the windings W1, W2, W3, W4 and W5, as compared to a prior art transformer which performs single-stage electromagnetic induction, the transformer 10 of an embodiment of the present invention has a smaller constant quality factor circle (constant Q circle), the transformer 10 and the RF amplifier 100 have a greater bandwidth and a less insertion loss. Moreover, the transformer 10 would have a smaller compact area in a condition that the transformer ratios are the same.

In an embodiment of the present invention, the RF amplifier 100 is used as a transmitter in a radio frequency (RF) device, and the input signals IN1, IN2, IN3, IN4 and IN4 may be different RF signals. According to the enable signals En1, En2, En3 and En4, the output power of the transmitter of the RF device could be switched among various output powers and the impedance matching of the RF amplifier 100 could be adjusted simultaneously.

Moreover, if the amplifiers 120 and 140 are differential amplifiers, a capacitor C1 may be added and coupled between two output ends T3 and T4 of the amplifier 120, and a capacitor C2 may be added and coupled between two output ends T7 and T8 of the amplifier 140. In the condition that the impedance matchings to which the RF amplifier 100 could be switched are fixed, the required equivalent inductance of each winding could be reduced by connecting the capacitor C1 with the windings W1, W2 and the first part L1 in parallel and connecting the capacitor C2 with the windings W3, W4 and the second part L2.

Figure 2:
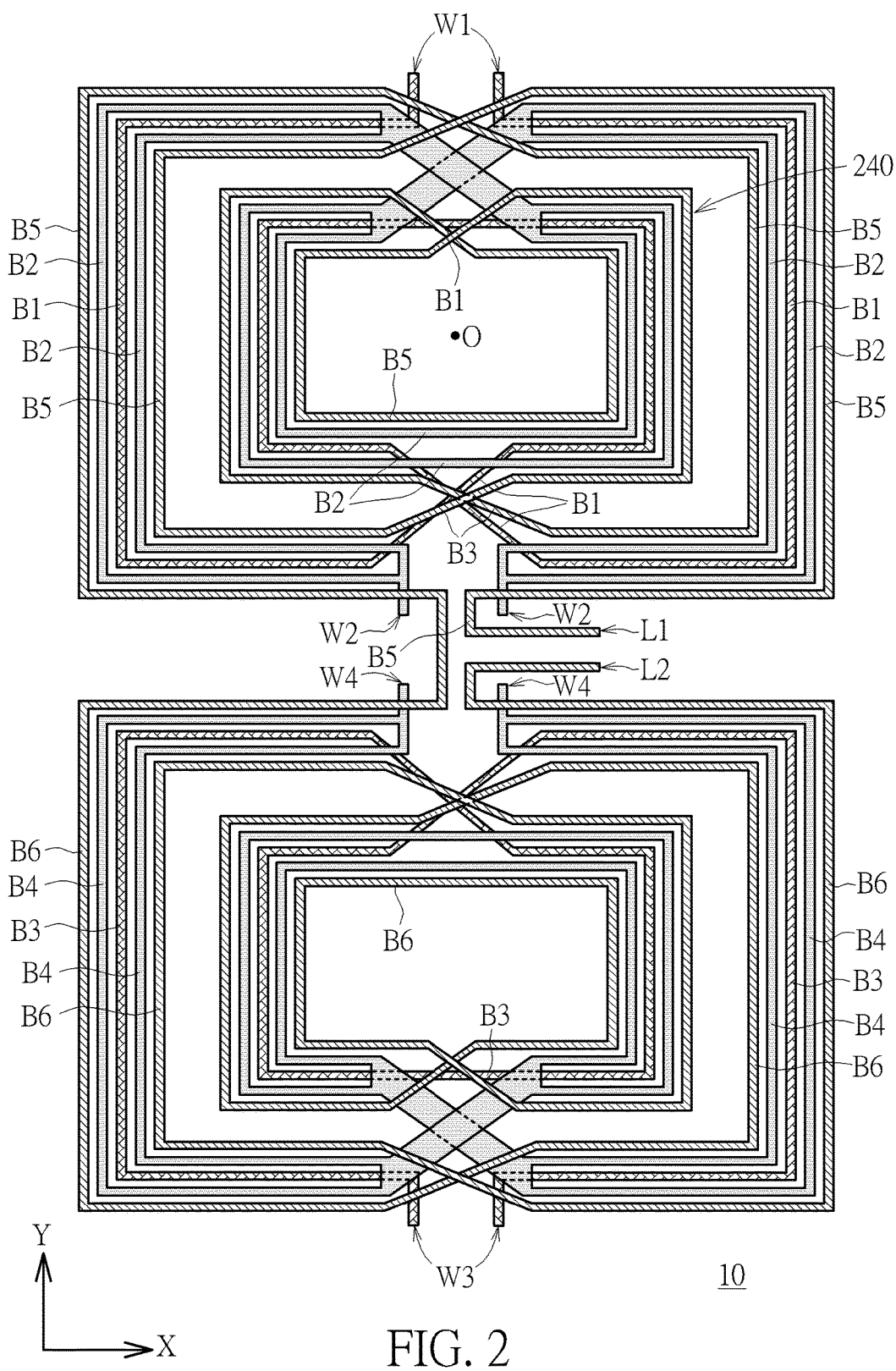
FIG. 2 is a layout diagram of a transformer according to an embodiment of the present invention.
Figure 3:
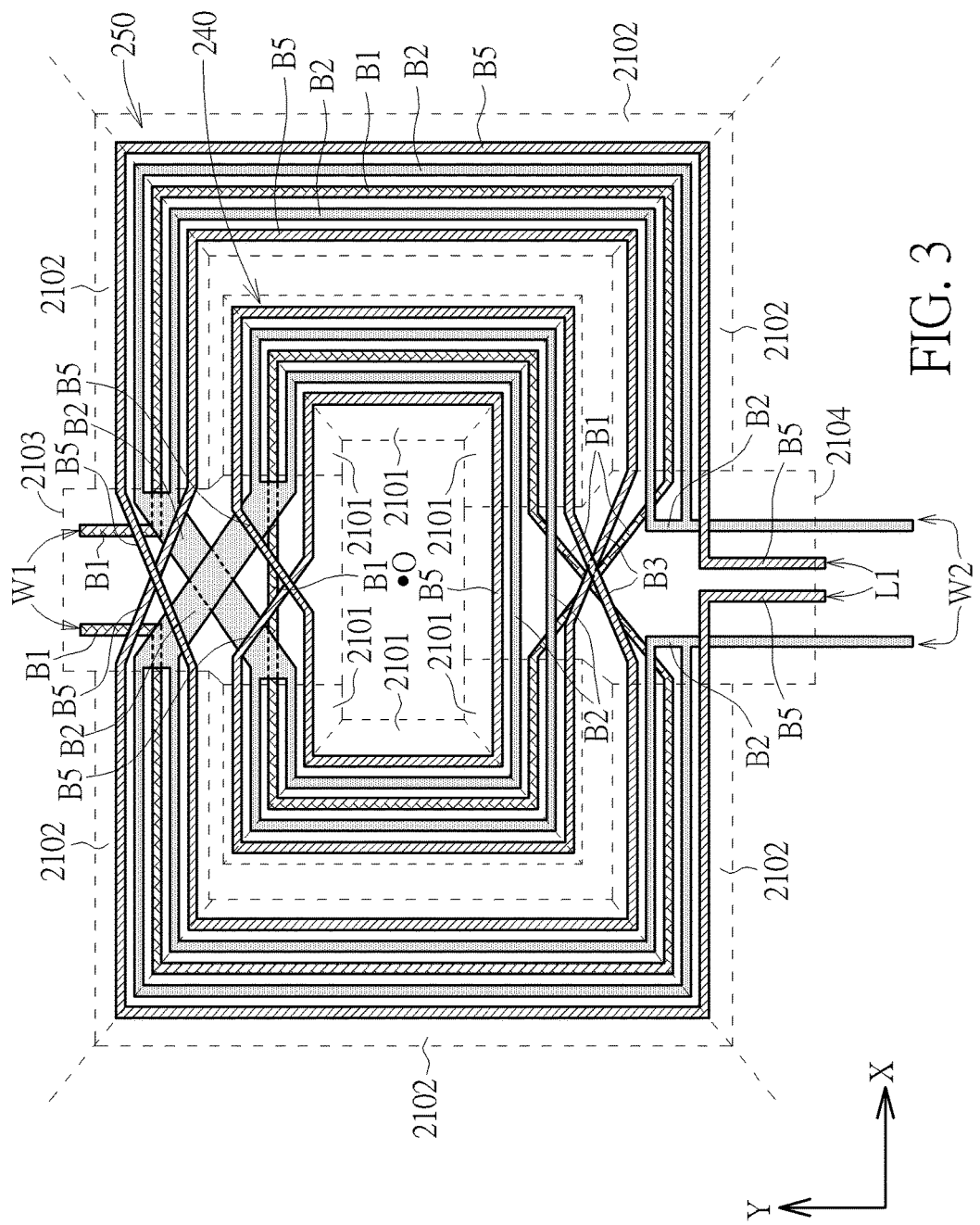
FIG. 3 is a layout diagram of a winding W1, a winding W2 and a first part L1 shown in FIG. 2.
Figure 4:
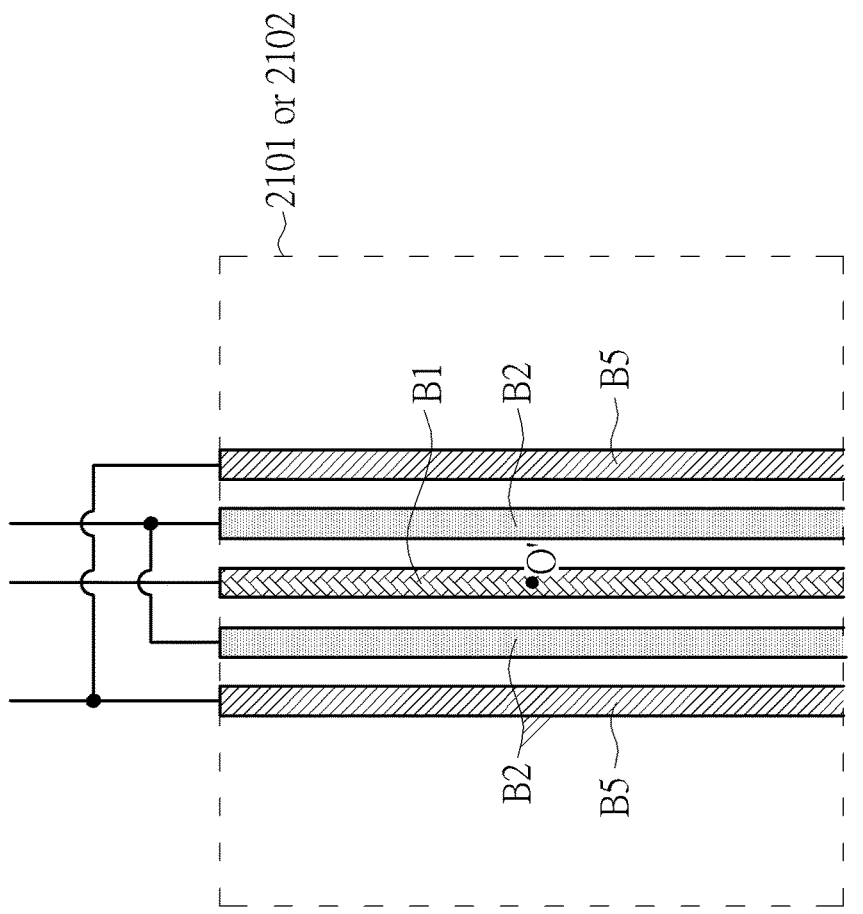
FIG. 4 is an enlarged view of the windings W1 and W2 and the first part L1 of the transformer located within an area shown in FIG. 3.

In a preferred embodiment of the present invention, if few flux loss resulted from routing the windings is ignored, the windings W1 and W2 are substantially completely magnetically coupled, the winding W2 and the first part L1 are substantially completely magnetically coupled, and the first part L1 is substantially completely magnetically isolated from the winding W1. In an embodiment of the present invention, a distance between the winding W1 and the first part L1 exits and is not too great, such that the winding W1 and the first part L1 would be substantially completely magnetically coupled if the winding W2 is not provided to supply magnetic isolation between the winding W1 and the first part L1. Moreover, the plane on which the windings W1, W2 and the first part L1 are positioned is parallel with a reference plane or coincides with the reference plane, and geometry centers of the three windings W1, W2 and the first part L1 projected on the reference plane substantially coincide with each other. A plurality of embodiments of the present invention would be set forth in the below description. Please refer to FIGS. 2, 3 and 4. FIG. 2 is a layout diagram of a transformer 10 according to an embodiment of the present invention. FIG. 3 is a layout diagram of the windings W1, W2 and the first part L1 shown in FIG. 2. FIG. 4 is an enlarged view of the windings W1, W2 and the first part L1 of the transformer 10 located within an area 2101 or 2102 shown in FIG. 3. In the embodiment, because layouts of the winding W1, the winding W2 and the first part L1 are almost symmetrical with the layouts of the winding W3, the winding W4 and the second part L2, the descriptions of the layouts of the winding W1, the winding W2 and the first part L1 could be used to explain the layouts of the winding W3, the winding W4 and the second part L2.

In the embodiment of FIGS. 2-4, the reference plane is XY plane formed by X axis and Y axis, and a section B1 of the winding W1, a plurality of sections B2 of the winding W2 and a plurality of sections B5 of the first part L1 are positioned within each area 2101 or 2102 on XY plane. The section B1, the sections B2 and the sections B5 are parallel within the area 2101 or 2102. Moreover, the sections B2 are positioned adjacent to two sides of the section B1 and adjacent inner sides of the sections B5. Due to the foresaid positing of the windings W1, W2 and the first part L1, the windings W1 and W2 are substantially completely magnetically coupled, the winding W2 and the first part L1 are substantially completely magnetically coupled, and the first part L1 is substantially completely magnetically isolated from the winding W1 by the winding W2. Moreover, the windings W1, W2 and the first part L1 form an inner ring 240 and an outer ring 250. The inner ring 240 is formed within a plurality of areas 2101, and the outer ring is formed within a plurality of areas 2102. The geometry centers of the windings W1, W2 and the first part L1 (i.e. the centers of the areas surrounded by the windings W1, W2 and the first part L1) are a point O on the XY plane, or the geometry centers of the windings W1, W2 and the first part L1 almost coincide with each other. Similarly, a section B3 of the winding W3, a plurality of sections B4 of the winding W4 and a plurality of sections B6 of the second part L2 are positioned within each area 2101 or 2102 on XY plane, and the layouts of the sections B3, B4 and B6 are almost symmetrical with the layouts of the sections B1, B2 and B5. Therefore, detail descriptions of the sections B3, B4 and B6 are omitted for the sake of simplification.

Moreover, the sections of the windings W1, W2 and the first part L1 within the areas 2103 and 2104 are formed on different planes. The sections B2 of the winding W2 within the areas 2103 and 2104 stretch over the sections B1 of the winding W1, and the sections B5 of the first part L1 within the areas 2103 and 2104 stretch over the sections B2 of the winding W2. The two sections B2 of the winding W2 within the area 2103 are interlaced and not contact to each other so as to connect the sections B2 located at the inner ring 240 and the outer ring 250. The two sections B1 of the winding W1 within the area 2104 are interlaced and not contact to each other so as to connect the sections B1 located at the inner ring 240 and the outer ring 250. The two sections B5 of the first part L1 within the area 2104 are interlaced and not contact to each other so as to connect the sections B3 located at the inner ring 240 and the outer ring 250. In an embodiment of the present invention, the sections B2 of the winding W2 within the area 2013 may completely overlap the entire area 2103 so as to isolate the sections B1 within the area 2103 from the sections B5 within the area 2103. In an embodiment of the present invention, the windings W1, W2 and the first part L1 are respectively formed by the sections B1, B2 and B5 within a single area 2101 or 2102 as shown in FIG. 3. The geometry center of the section B1, the geometry center of the sections B2 and the geometry center of the sections B5 are a point O' on the XY plane, or the geometry center of the section B1, the geometry center of the sections B2 and the geometry center of the sections B3 almost coincide with each other.

Figure 5:
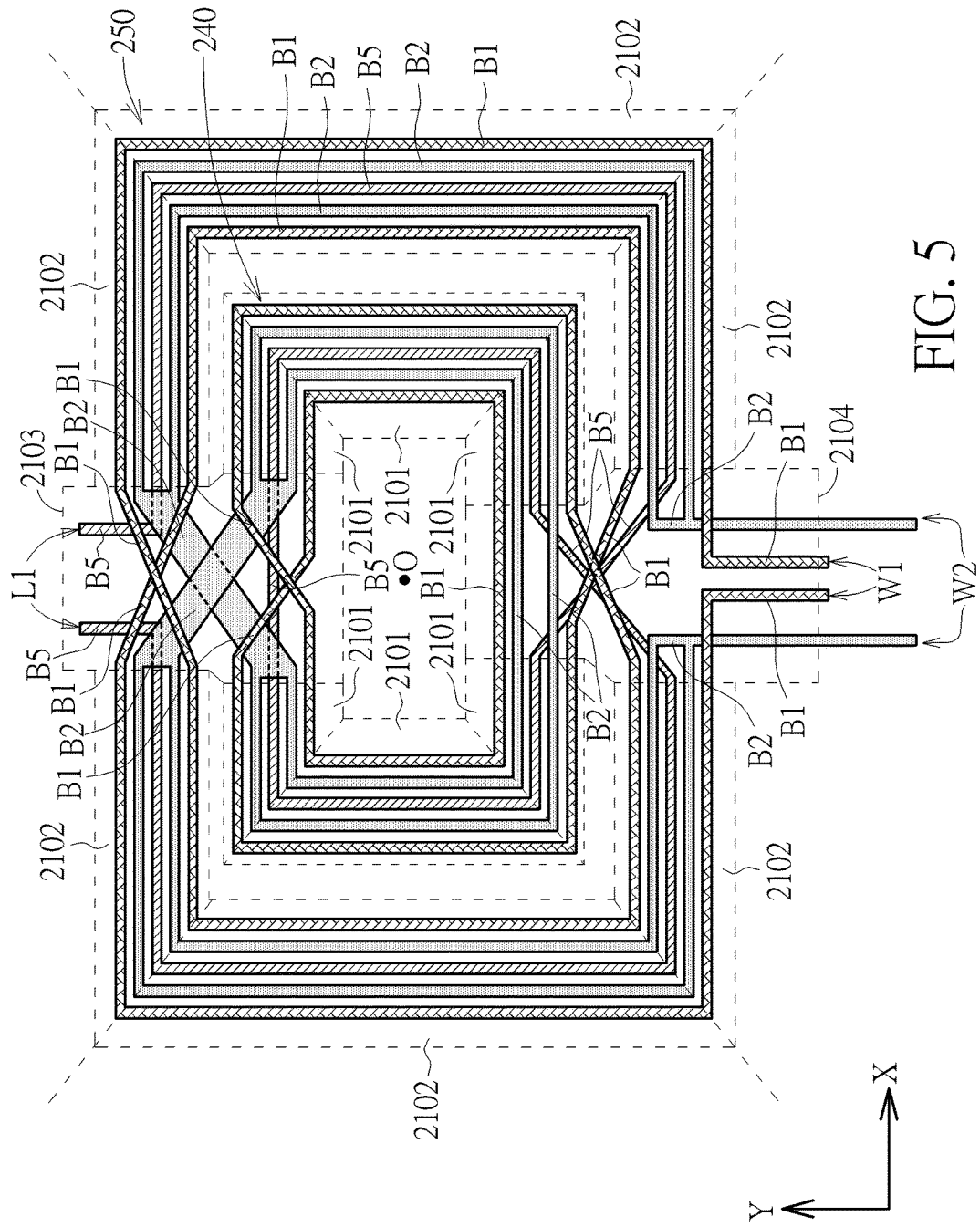
FIG. 5 is a layout diagram of the winding W1, the winding W2 and the first part L1 of another transformer according to another embodiment of the present invention.

Please refer to FIG. 5. FIG. 5 is a layout diagram of the winding W1, the winding W2 and the first part L1 of another transformer according to another embodiment of the present invention. As compared to FIG. 3, the positions of the winding W1 and the first part L1 are switched in FIG. 5.

Figure 6:
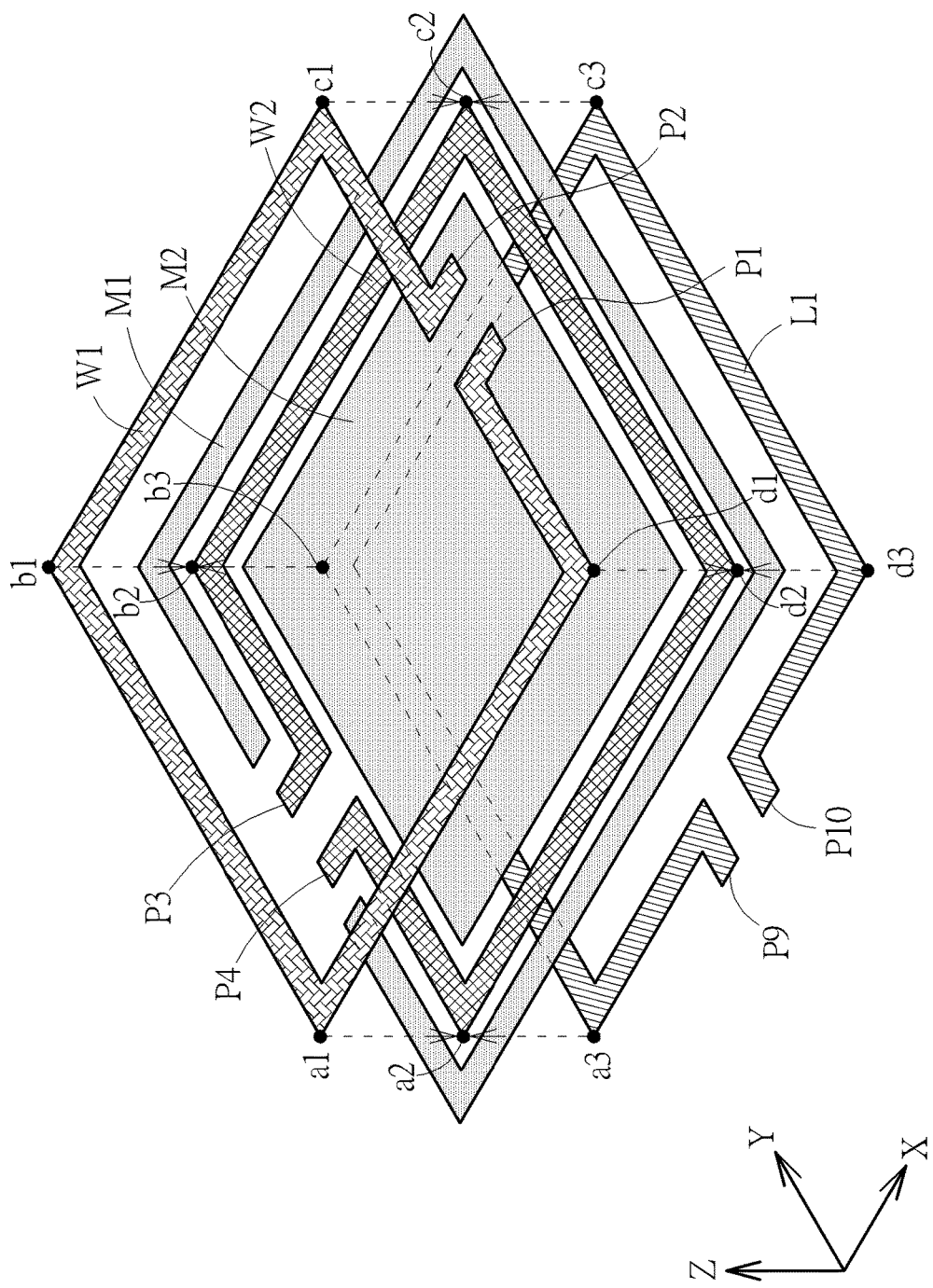
FIG. 6 is an exploded diagram of the winding W1, the winding W2 and the first part L1 of a transformer according to another embodiment of the present invention.
Figure 7:
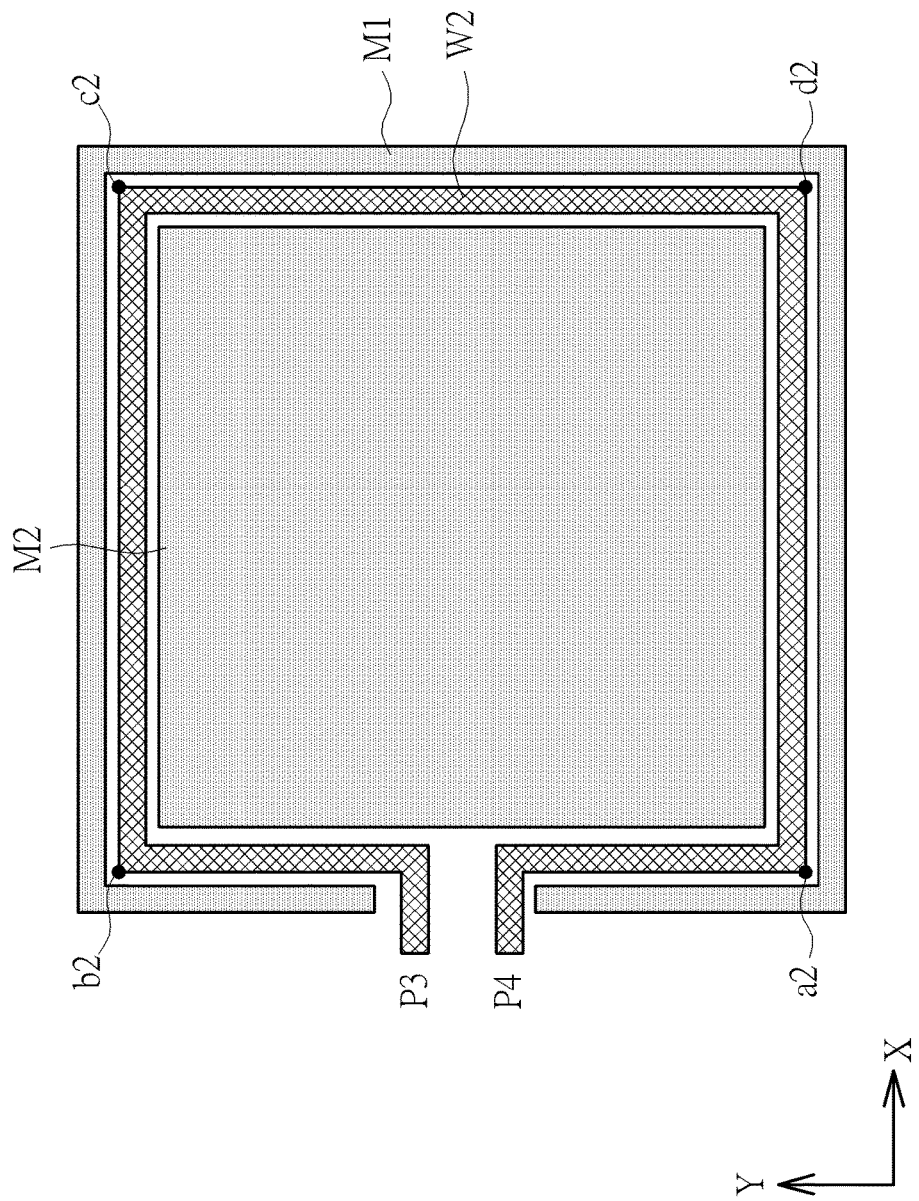
FIG. 7 is a schematic diagram of conductors M1 and M2 and a winding W2 of the transformer shown in FIG. 6.

Please refer to FIGS. 6 and 7. FIG. 6 is an exploded diagram of the winding W1, the winding W2 and the first part L1 of a transformer according to another embodiment of the present invention. FIG. 7 is a schematic diagram of conductors M1 and M2 and the winding W2 of the transformer shown in FIG. 6. The ends P9 and P10 of the first part L1 in FIG. 6 may be corresponded to the ends P9 and P10 of the first part L1 in FIG. 1. In the embodiment, the windings W1, W2 and the first part L1 are positioned on three different parallel planes. In detail, the three parallel planes on which the W1, W2 and the first part L1 are positioned are parallel with the XY plane, and the coordinates of the three parallel planes on the Z axis are different. Moreover, as shown in FIG. 7, the conductors M1 and M2 and the winding W2 are positioned on the same plane, the conductor M1 is positioned adjacent to an outer side of the winding W2 and substantially surrounds the winding W2, and the conductor M2 is positioned adjacent to an inner side of the winding W2. In an embodiment of the present invention, the conductors M1 and M2 are grounded to provide a better magnetic isolation between the winding W1 and the first part L1. Moreover, as shown in FIG. 6, the corner-points a1, b1, c1 and d1 of the winding W1 respectively align with the corner-points a2, b2, c2 and d2 of the winding W2 and the corner-points a3, b3, c3 and d3 of the first part L1. If the plane on which the winding W2 is positioned is regarded as the reference plane, projected geometry centers of the winding W1 and the first part L1 on the reference plane would be or almost coincide with the center of the area surrounded by the winding W2 (i.e. the geometry center of the winding W2). In an embodiment of the present invention, the windings W1, W2 and the first part L1 are electrically disconnected. In another embodiment of the present invention, the windings W1, W2 and the first part L1 are grounded or coupled to a power supply. Moreover, the widths of the windings W1, W2 and the first part L1 may be the same, and the two ends P1 and P2 of the winding W1, the two ends P3 and P4 of the winding W2 and the two ends P5 and P6 of the first part L1 are respectively poisoned on three different sides of the transformer 10. Due to the foresaid positing of the windings W1, W2 and the first part L1, the windings W1 and W2 are substantially completely magnetically coupled, the winding W2 and the first part L1 are substantially completely magnetically coupled, and the first part L1 is substantially completely magnetically isolated from the winding W1 by the winding W2.

Figure 8:
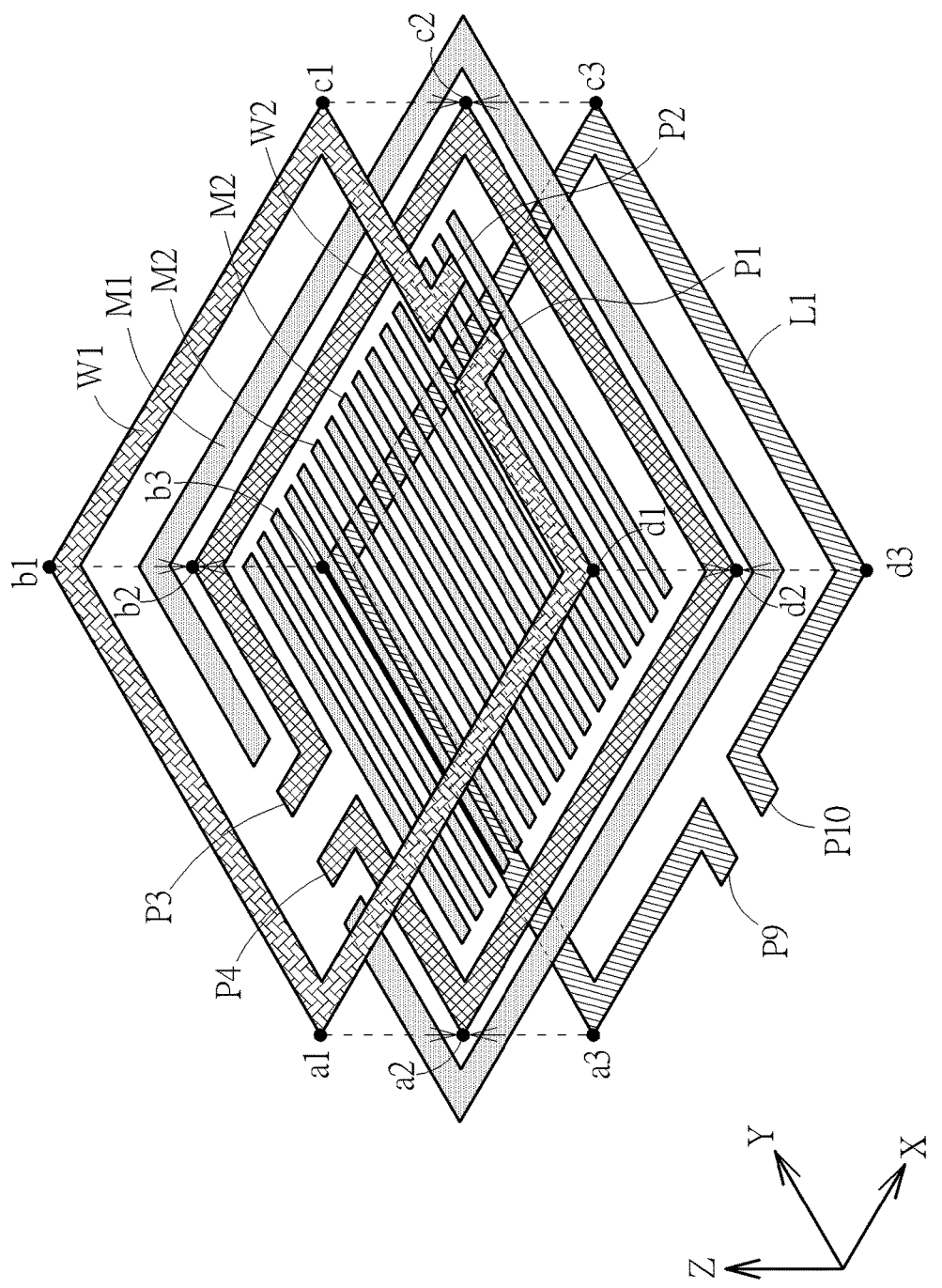
FIG. 8 is an exploded diagram of the winding W1, the winding W2 and the first part L1 of a transformer according to another embodiment of the present invention.
Figure 9:
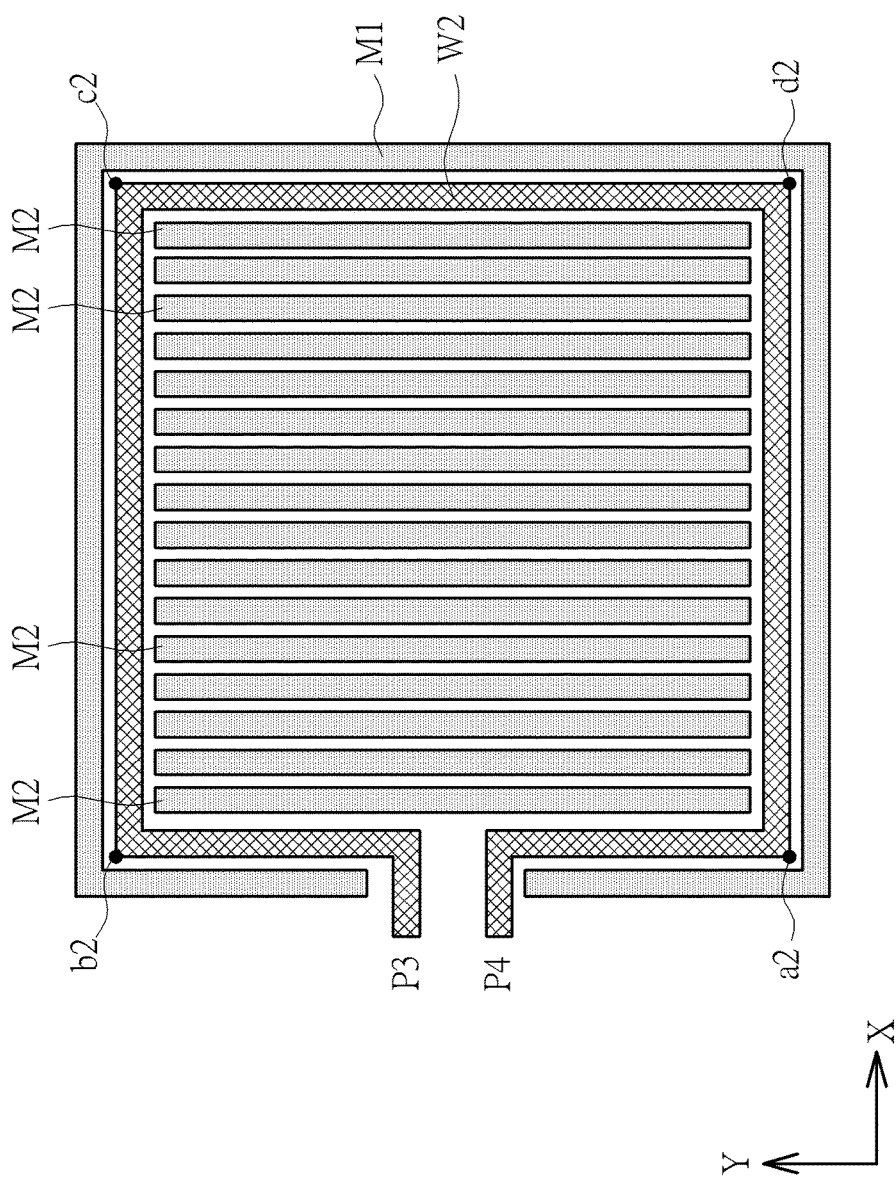
FIG. 9 is a schematic diagram of conductor M1 and M2 of a winding W2 of the transformer shown in FIG. 8.

Please refer FIGS. 8 and 9. FIG. 8 is an exploded diagram of the winding W1, the winding W2 and the first part L1 of a transformer according to another embodiment of the present invention. FIG. 9 is a schematic diagram of conductor M1 and M2 of a winding W2 of the transformer shown in FIG. 8. The difference between the transformers in FIGS. 8 and 6 is the structure of the conductor(s) M2. As shown in FIG. 9, the transformer 10 comprises a plurality of bar-shaped conductors M2. The conductors M2 are separated and parallel substantially. The purpose of positing the conductors M2 is to avoid increasing of the quality factor (i.e. Q factor) of the transformer 10 due to the eddy current of the transformer 10.

In summary, the embodiments of the present invention provide transformers, and each of the transformers has a first part magnetically isolated from a first winding by a second winding. Moreover, the transformer outputs a third signal by performing a two-stage electromagnetic induction by the winding W1, the winding W2 and the first part L1. As compared to a prior art transformer which performs single-stage electromagnetic induction, the transformer of the present invention has a smaller constant quality factor circle (constant Q circle). Accordingly, as compared to the prior art transformer, the transformer and the RF amplifier of the present invention have a greater bandwidth and a less insertion loss. In a condition that the transformer according to the present invention has the same transformer ratios as the prior, the transformer of the present invention has a smaller compact area. Moreover, the RF amplifier of the present invention would obtain optimum impedance matchings for different output powers.

Figure 10:
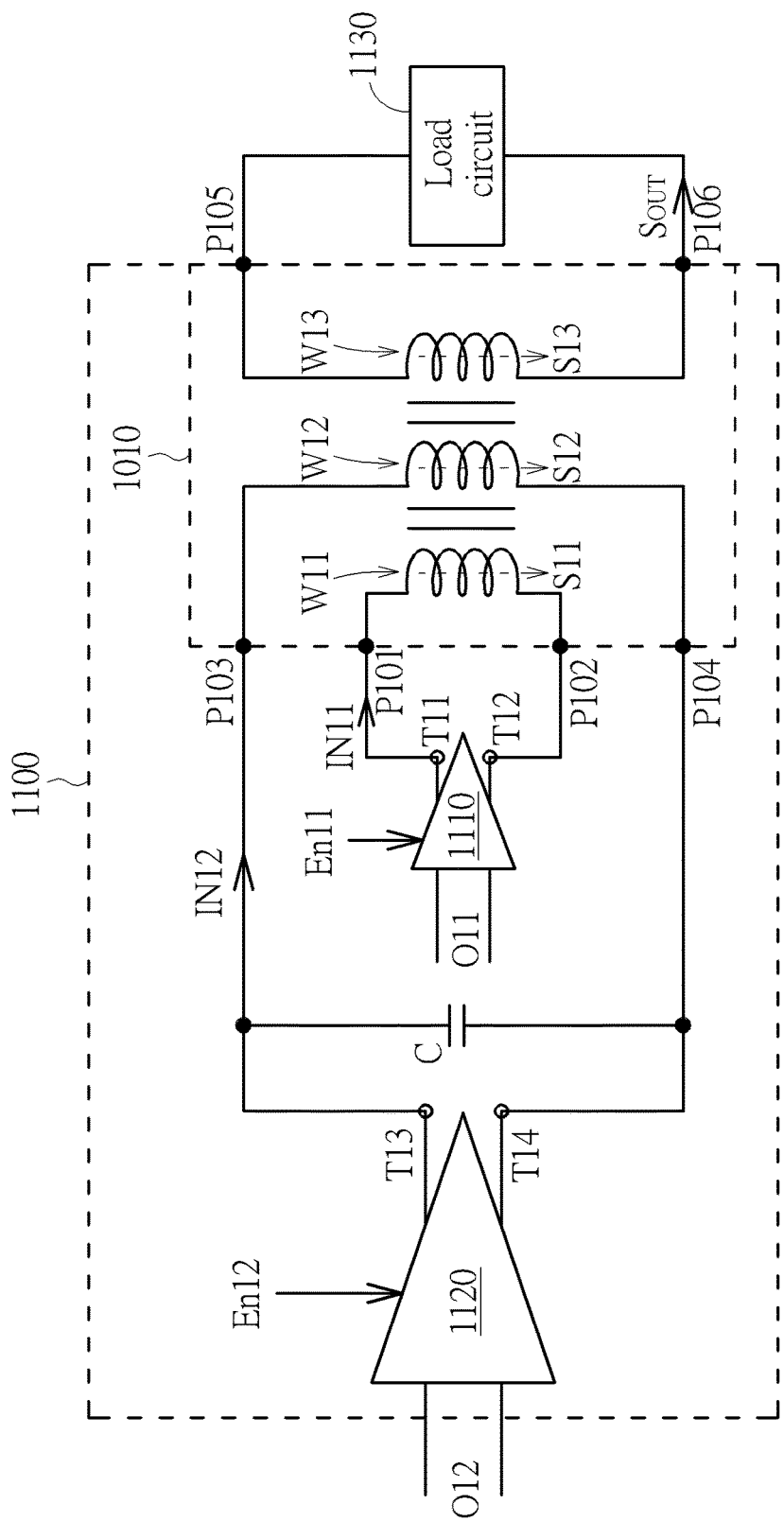
FIG. 10 is a circuit diagram of radio frequency amplifier according to another embodiment of the present invention.

Please refer FIG. 10. FIG. 10 is a circuit diagram of radio frequency amplifier 1100 according to another embodiment of the present invention. The RF amplifier 1100 is coupled to a load circuit 1130 and comprises two amplifiers 1110 and 1120 and a transformer 1010. The transformer 1010 comprises three windings W11, W12 and W13. The winding W11 is configured to receive an input signal IN11 and generate a signal S11. The winding W12 is magnetically coupled to the winding W11 and is configured to generate a signal S12 through electromagnetic induction with the first winding W11 and/or by receiving another input signal IN12. The winding W13 is magnetically coupled to the winding W12 and magnetically isolated from the winding W11. The winding W13 is configured to generate a signal S13 and output a signal $S_{OUT}$ through electromagnetic induction with the second winding W12. The winding W12 is positioned between the windings W11 and W13. The winding W11 is positioned adjacent to the winding W12, and the winding W12 is positioned adjacent to the winding W13. In the below description, it would explain how to electromagnetically isolate the winding W13 from the winding W11. Moreover, when the input signal IN11 is inputted to the winding W11, the winding W11 generates the signal S11. The signal S12 generated by the winding W12 may be resulted from inputting the input signal IN12 to the winding W12, electromagnetic induction with the first winding W11, or both inputting the input signal IN2 to the winding W12 and the electromagnetic induction with the first winding W11.

The amplifiers 1110 and/or 1120 may be high-frequency amplifiers or power amplifiers in view of their functions. In view of the numbers of input/output ends of the amplifiers 1110 and 1120, the amplifiers 1110 and/or 1120 may be single-ended amplifiers or differential amplifiers. However, the present invention is not limited thereto. In the embodiment, the amplifiers 1110 and 1120 are differential amplifiers. An input end of the amplifier 1110 is coupled to a signal source O11, and an input end of the amplifier 1120 is coupled to a signal source O12. The amplifiers 1110 and 1120 respectively amplify signals outputted from the signal sources O11 and O12 to output the input signals IN11 and IN12 according to enable signals En11 and En12. An output end T11 of the amplifier 1110 is coupled to an end P101 of the winding W11, and the input signal IN11 is output from the amplifier 1110 to the end P101 of the winding W11. An output end T13 of the amplifier 1120 is coupled to an end P103 of the winding W12, and the input signal IN12 is output from the amplifier 1120 to the end P103 of the winding W12. Moreover, the amplifiers 1110 and 1120 further comprise output ends T12 and T14 respectively, which are coupled to the ends P102 and P104 of the windings W11 and W12.

In the embodiment, the amplifier 1110 is activated by an enable signal En11 so as to output the input signal IN11 to the winding W11. Similarly, the amplifier 1120 is activated by an enable signal En12 so as to output the input signal IN12 to the winding W12. It is noted that the power of the signal S12 generated by the winding W12 would be changed when the amplifier 1120 is activated by an enable signal En12. The enable signals En11 and En12 may be the power supply signals of the amplifiers 1110 and 1120, control signals of a bias circuit, system voltages (VDD or VCC) of the radio frequency amplifier 1110 or bias voltages of the radio frequency amplifier 1110.

Moreover, the impedance matching of the radio frequency amplifier 1110 could be adjusted by enabling/disabling the amplifiers 1110 and/or 1120. In detail, the impedance matching provided by the transformer 1010 could be switched between a first impedance matching and a second impedance matching based on the enable signals En1 and En2. When the amplifier 1110 is enabled and the amplifier 1120 is disabled, the transformer 1010 provides the first impedance matching by performing a two-stage electromagnetic induction which comprises the electromagnetic induction between the windings W1 and W2 resulted from inputting the signal IN1 and the electromagnetic induction between the windings W2 and W3 which results in the generation of the signal S3. When the amplifier 1110 is disabled and the amplifier 1120 is enabled, the transformer 1010 provides the second impedance matching. Moreover, the amplifiers 1110 and 1120 may be enabled simultaneously, such that the impedance matching provided by the transformer 1010 is a third impedance matching. Accordingly, the impedance matching provided by the transformer 1010 is switched among the first impedance matching, the second impedance matching and the third impedance matching. In an embodiment the transformer ratios of the windings W11, W12 and W13 is 1:2:4, the load impedance of the load circuit 1130 is 50Ω. Therefore, the first impedance matching is equal to 50/4=12.5Ω, the second impedance matching is equal to 50/2=25Ω, and a typical value (i.e. equivalent value) of third impedance matching is equal to $$\frac{(25 \times 12.5)}{(25 + 12.5)} = 8.3 \, \Omega.$$

Thus, the second impedance matching is greater than the first impedance matching, and the third impedance matching is less than the first impedance matching and the second impedance matching. In another embodiment of the present invention, the second impedance matching is less than the first impedance matching, and the third impedance matching is less than the first impedance matching and the second impedance matching.

Moreover, the operation of inputting the input signal IN11 to the winding W11 is performed according to the enable signal En11, and the operation of inputting the input signal IN12 to the winding W12 is performed according to the enable signal En12. The transformer 1010 may provide the first impedance matching by inputting the input signal IN11 to the winding W11, such that the load impedance of the output signal SOUT matches the input signal IN11. Moreover, the transformer 1010 may provide the second impedance matching by inputting the input signal IN12 to the winding W12, such that the load impedance of the output signal SOUT matches the input signal IN12. Therefore, by inputting the input signal IN11 or IN12, the impedance matching provided by the transformer 1010 would be switched between the first impedance matching and the second impedance matching. Wherein, the transformer 1010 provides the first impedance matching when the input signal IN11 is inputted and the input signal IN12 is not inputted. The transformer 1010 provides the second impedance matching when the input signal IN11 is not inputted and the input signal IN12 is inputted. Moreover, when both of the input signals IN11 and IN12 are inputted, the transformer 1010 provides the third impedance matching.

Moreover, the output power of the RF amplifier 1100 could be adjusted according to the enable signals En11 and En12. In other words, if the output power of the RF amplifier 1100 is equal to PW11 when the amplifier 1110 is enabled and the amplifier 1120 is disabled, and if the output power of the RF amplifier 1100 is equal to PW12 when the amplifier 1110 is disabled and the amplifier 1120 is enabled, then the output power of the RF amplifier 1100 is substantially equal to (PW11+PW12) when both of the amplifiers 1110 and 1120 are enabled and the energy losses are ignored. Therefore, the output power of the RF amplifier 1100 could be switched to 0, PW11, PW12 or (PW11+PW12) according to the enable signals En11 and En12. Accordingly, various demands for the output power of the RF amplifier 1100 would be satisfied.

In an embodiment of the present invention, it is supposed that the winding W11 has an equivalent inductance I11, the winding W2 has an equivalent inductance I12 and the winding W3 has an equivalent inductance I13. The equivalent inductances I11, I12 and I13 are sequentially increasing or decreasing, and such relationships among the equivalent inductances I11, I12 and I13 may be determined according to the practical demands of the application of the circuit (e.g. gain, efficiency, power, SNR, etc.). In other words, relationships among the equivalent inductances I11, I12 and I13 may be I11>I12>I13 or I11<I12<I13. The equivalent inductances I11, I12 and I13 would be determined by adjusting the turns or widths of the windings W11, W12 and W13. Take adjusting the turns of the windings W11, W12 and W13 for example, if I11>I12>I13, a number of turns of the winding W11 is greater than a number of turns of the winding W12, and the number of turns of the winding W12 is greater than a number of turns of the winding W13. Take adjusting the widths of the windings W11, W12 and W13 for example, if I11>I12>I13, the width of the winding W11 is less than the width of the winding W12, and the width of the winding W12 is less than the width of the winding W13.

In an embodiment of the present invention, I11<I12<I13 and the output power of the amplifier 1120 is less than the output power of the amplifier 1110. For example, if the ratios of I11:I12:I13 are 1:2:4, then the transformer ratios of the windings W1, W2 and W3 would be also 1:2:4. Therefore, the second impedance matching would be greater than the first impedance matching, and the typical value of the third impedance matching would be less than the first impedance matching and the second impedance matching. Accordingly, a greater output power has a less impedance matching. In another embodiment of the present invention, I11>I12>I13 and the output power of the amplifier 1120 is greater than the output power of the amplifier 1110. Since the transformer 1010 outputs the signal S13 by performing the two-stage electromagnetic induction by the windings W1, W2 and W3, as compared to a prior art transformer which performs single-stage electromagnetic induction, the transformer 1010 of the present invention has a smaller constant quality factor circle (constant Q circle), the transformer 1010 and the RF amplifier 1100 have a greater bandwidth and a less insertion loss. Moreover, the transformer 1010 would have a smaller compact area in a condition that the transformer ratios are the same.

In an embodiment of the present invention, the RF amplifier 1100 is used as a transmitter in a radio frequency (RF) device, and the input signals IN11 and IN12 are two different RF signals. According to the enable signals En11 and En12, the output power of the transmitter of the RF device could be switched among various output powers and the impedance matching of the RF amplifier 1100 could be adjusted simultaneously.

Moreover, if the amplifier 1120 is a differential amplifier, a capacitor C may be added and coupled between two output ends T13 and T14 of the amplifier 1120. In the condition that the impedance matchings to which the RF amplifier 1100 could be switched are fixed, the required equivalent inductances of the windings W11, W12 and W13 could be reduced by connecting a plurality of the capacitors C with the windings W11, W12 and W13 in parallel.

Figure 11:
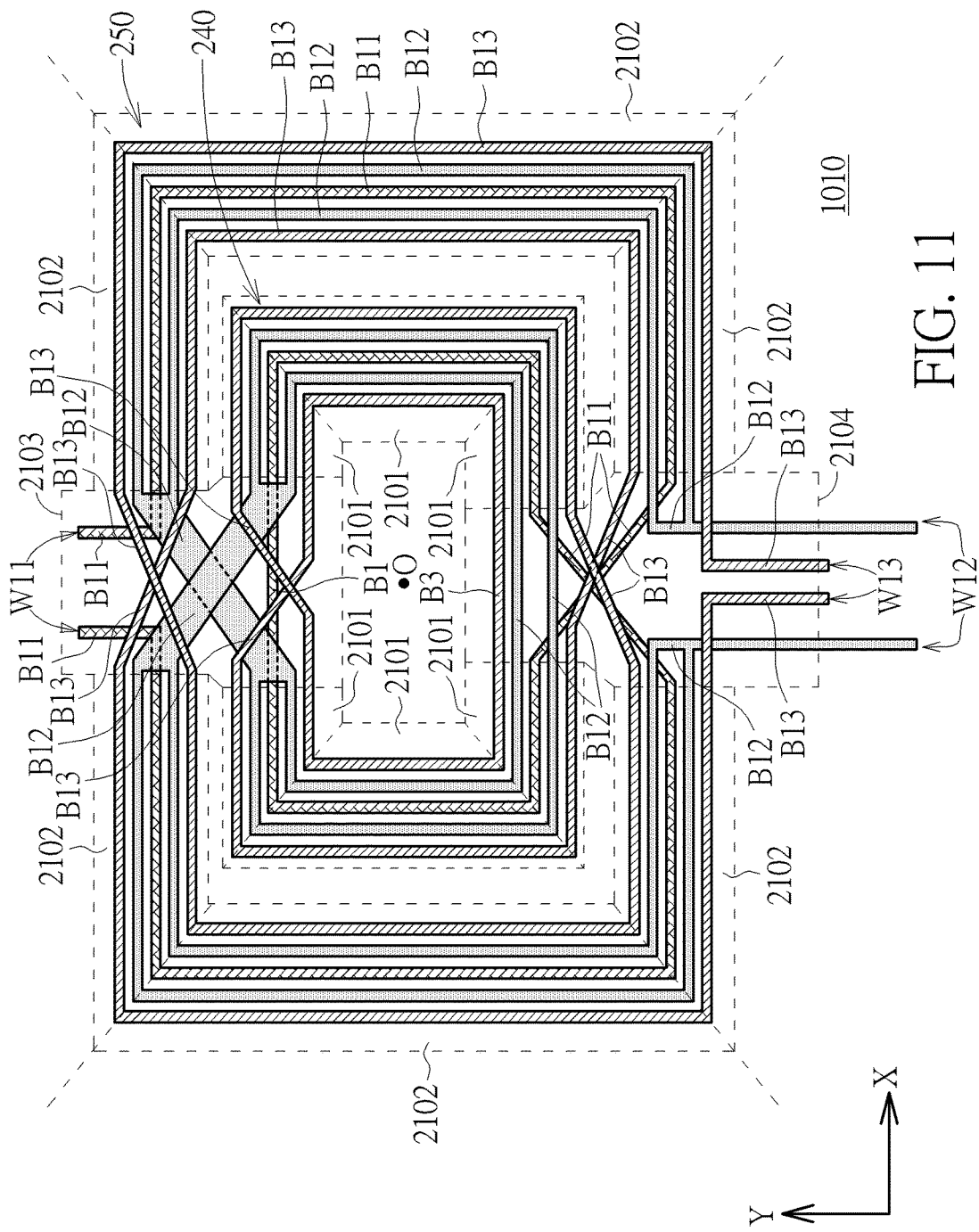
FIG. 11 is a layout diagram of a transformer according to another embodiment of the present invention.
Figure 12:
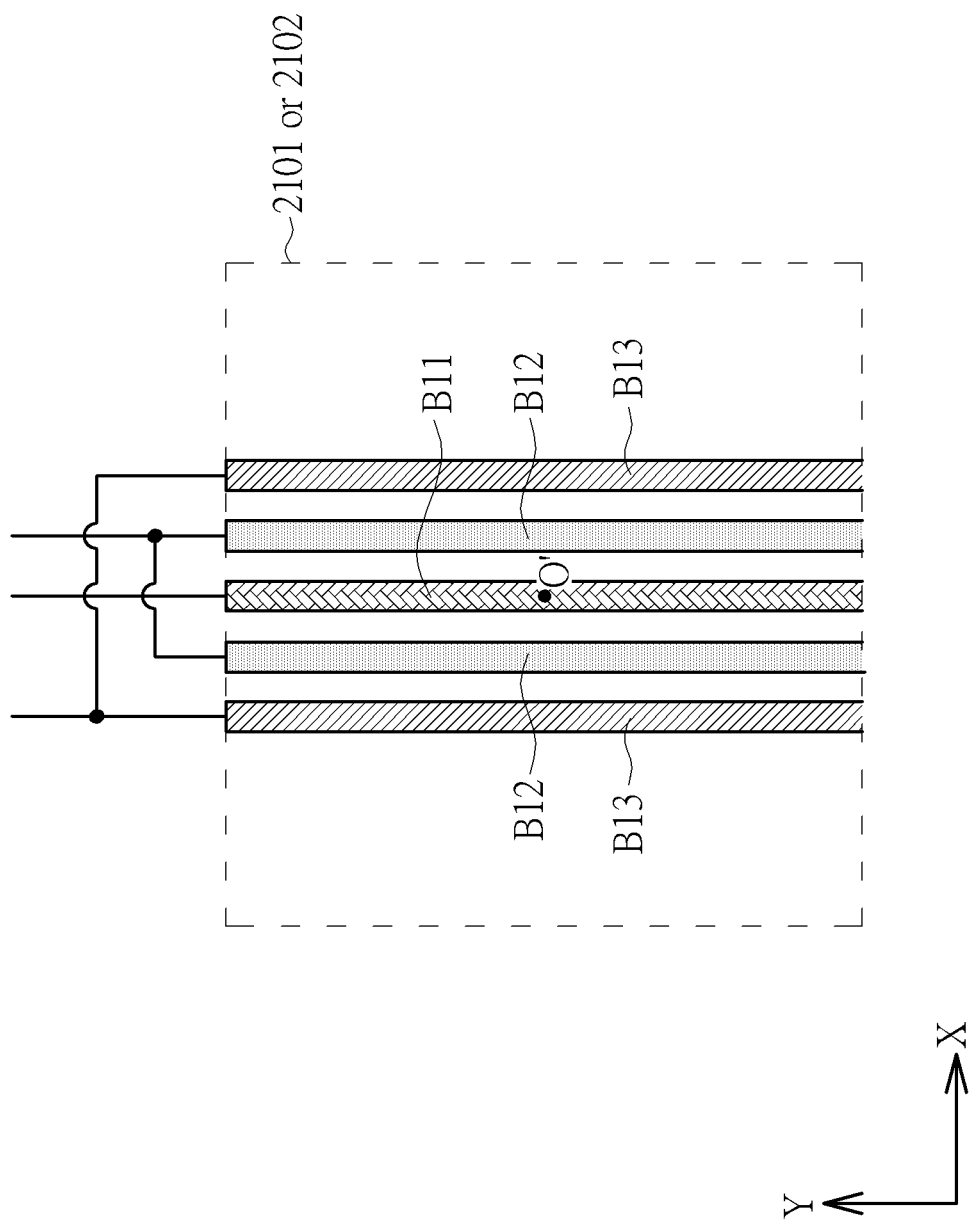
FIG. 12 is an enlarged view of the windings W1, W2 and W3 of the transformer located within an area shown in FIG. 11.

In a preferred embodiment of the present invention, if few flux loss resulted from routing the windings is ignored, the windings W11 and W12 are substantially completely magnetically coupled, the windings W12 and W13 are substantially completely magnetically coupled, and the winding W13 is substantially completely magnetically isolated from the winding W11. In an embodiment of the present invention, the distance between the windings W11 and W13 is not too great, such that the windings W11 and W13 would be substantially completely magnetically coupled if the winding W12 is not provided to supply magnetic isolation between the windings W11 and W13. Moreover, the plane on which the windings W11, W12 and W13 are positioned is parallel with a reference plane or coincides with the reference plane, and geometry centers of the three windings W11, W12 and W13 projected on the reference plane substantially coincide with each other. A plurality of embodiments of the present invention would be set forth in the below description. Please refer to FIG. 11. FIG. 11 is a layout diagram of a transformer 1010 according to an embodiment of the present invention. In the embodiment, the reference plane is XY plane formed by X axis and Y axis, and a section B11 of the winding W11, a plurality of sections B12 of the winding W12 and a plurality of sections B13 of the winding W13 are positioned within each area 2101 or 2102 on XY plane. The section B11, the sections B12 and the sections B13 are parallel within the area 2101 or 2102. Moreover, the sections B12 are positioned adjacent to two sides of the section B11 and adjacent inner sides of the sections B13. Due to the foresaid positing of the windings W11, W12 and W13, the windings W11 and W12 are substantially completely magnetically coupled, the windings W12 and W13 are substantially completely magnetically coupled, and the winding W13 is substantially completely magnetically isolated from the winding W11 by the winding W12. Moreover, the windings W11, W12 and W13 from an inner ring 240 and an outer ring 250. The inner ring 240 is formed within a plurality of areas 2101, and the outer ring is formed within a plurality of areas 2102. The geometry centers of the windings W11, W12 and W13 (i.e. the centers of the areas surrounded by the windings W11, W12 and W13) are a point O on the XY plane or almost coincide with each other. Moreover, the sections of the windings W11, W12 and W13 within the areas 2103 and 2104 are formed on different planes. The sections B12 of the winding W12 within the areas 2103 and 2104 stretch over the sections B11 of the winding W11, and the sections B13 of the winding W13 within the areas 2103 and 2104 stretch over the sections B12 of the winding W12. The two sections B12 of the winding W12 within the area 2103 are interlaced and not contact to each other so as to connect the sections B12 within the inner ring 240 and the outer ring 250. The two sections B11 of the winding W11 within the area 2104 are interlaced and not contact to each other so as to connect the sections B11 within the inner ring 240 and the outer ring 250. The two sections B13 of the winding W13 within the area 2104 are interlaced and not contact to each other so as to connect the sections B13 within the inner ring 240 and the outer ring 250. In an embodiment of the present invention, the sections B12 of the winding W12 within the area 2013 completely overlap the entire area 2103 so as to isolate the sections B11 within the area 2103 from the sections B13 within the area 2103. In an embodiment of the present invention, the windings W11, W12 and W13 are respectively formed by the sections B11, B12 and B13 within a single area 2101 or 2102 as shown in FIG. 12. The geometry center of the section B11, the geometry center of the sections B12 and the geometry center of the sections B13 are a point O' on the XY plane or almost coincide with each other. FIG. 12 is an enlarged view of the windings W11, W12 and W13 located within an area 2101 or 2102 shown in FIG. 11. FIG. 12 is similar with FIG. 4. FIG. 12 could be obtained by replacing the sections B1, B2 and B5 of FIG. 4 by sections B11, B12 and B13 respectively.

In an embodiment of the present invention, an exploded diagram of another transformer 1010 could be referred the descriptions of FIG. 6 and obtained by replacing the winding W1, the winding W2, the first part L1, the ends P1 to P4 and P9 to P10 of FIG. 6 by the winding W11, the winding W12, the winding W13, and the ends P101 to P106 respectively.

In an embodiment of the present invention, diagrams of another transformer 1010 could be referred the descriptions of FIGS. 7-9 and obtained by replacing the winding W1, the winding W2, the first part L1, the ends P1 to P4 and P9 to P10 of FIGS. 7-9 by the winding W11, the winding W12, the winding W13, and the ends P101 to P106 respectively.

In summary, the embodiments of the present invention provide transformers, and each of the transformers has a third winding magnetically isolated from a first winding by a second winding. Moreover, the transformer outputs a third signal by performing a two-stage electromagnetic induction by the first winding, the second winding and the third winding. As compared to a prior art transformer which performs single-stage electromagnetic induction, the transformer of the present invention has a smaller constant quality factor circle (constant Q circle). Accordingly, as compared to the prior art transformer, the transformer and the RF amplifier of the present invention have a greater bandwidth and a less insertion loss. In a condition that the transformer according to the present invention has the same transformer ratios as the prior, the transformer of the present invention has a smaller compact area. Moreover, the RF amplifier of the present invention would obtain optimum impedance matchings for different output powers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transformer, comprising:
a first winding;
a second winding;
a third winding;
a fourth winding; and
a fifth winding comprising a first part and a second part serially connected to the first part, the first part being magnetically coupled to the second winding and magnetically isolated from the first winding, and the second part being magnetically coupled to the fourth winding and magnetically isolated from the third winding;

wherein the second winding is positioned between the first winding and the first part, the first winding is positioned adjacent to the second winding, and the second winding is positioned adjacent to the first part;

wherein the fourth winding is positioned between the third winding and the second part, the third winding is positioned adjacent to the fourth winding, and the fourth winding is positioned adjacent to the second part;

wherein the transformer is coupled to a first amplifier, a second amplifier, a third amplifier, and a fourth amplifier;

wherein an output end of a first amplifier is coupled to an end of the first winding, and the first amplifier operates according to a first enable signal so as to output a first input signal to the first winding;

wherein an output end of a second amplifier is coupled to an end of the second winding, and the second amplifier operates according to a second enable signal so as to output a second input signal to the second winding;

wherein an output end of a third amplifier is coupled to an end of the third winding, and the third amplifier operates according to a third enable signal so as to output a third input signal to the third winding; and wherein an output end of a fourth amplifier is coupled to an end of the fourth winding, and the fourth amplifier operates according to a fourth enable signal so as to output a fourth input signal to the fourth winding;

wherein a first equivalent inductance of the first winding is greater than a second equivalent inductance of the second winding, the second equivalent inductance of the second winding is greater than a fifth equivalent inductance of the first part of the fifth winding, a third equivalent inductance of the third winding is greater than a fourth equivalent inductance of the fourth winding, the fourth equivalent inductance of the fourth winding is greater than a sixth equivalent inductance of the second part of the fifth winding, an output power of the second amplifier is greater than an output power of the first amplifier, and an output power of the fourth amplifier is greater than an output power of the third amplifier.

2. The transformer of claim 1, wherein the first part of the fifth winding is magnetically isolated from the first winding by the second winding, and the second part of the fifth winding is magnetically isolated from the third winding by the fourth winding.

3. The transformer of claim 1, wherein sections of the first winding, sections of the second winding and sections of the first part are positioned on a same plane, and the sections of the first part are magnetically isolated from the sections of the first winding by the sections of the second winding;

wherein sections of the third winding, sections of the fourth winding and sections of the second part are positioned on a same plane, and the sections of the second part are magnetically isolated from the sections of the third winding by the sections of the fourth winding.

4. The transformer of claim 3, wherein the plane comprises at least a first area, and a first section of the first winding, a plurality of second sections of the second winding and a plurality of third sections of the first part are positioned within the first area of the same plane, the first section, the second sections and the third sections are parallel, and the second sections are positioned adjacent to two sides of the first section and adjacent inner sides of the third sections.

5. The transformer of claim 3, wherein the plane comprises at least a first area, and plurality of first sections of the first winding, a plurality of second sections of the second winding and a third section of the first part are positioned within the first area of the same plane, the first sections, the second sections and the third section are parallel, and the second sections are positioned adjacent to two sides of the third section and adjacent inner sides of the first sections.

6. The transformer of claim 3, wherein the plane comprises at least a second area, and a fourth section of the third winding, a plurality of fifth sections of the fourth winding and a plurality of sixth sections of the second part are positioned within the second area of the same plane, the fourth section, the fifth sections and the sixth sections are parallel, and the fifth sections are positioned adjacent to two sides of the fourth section and adjacent inner sides of the sixth sections.

7. The transformer of claim 3, wherein the plane comprises at least a second area, and a plurality of fourth sections of the third winding, a plurality of fifth sections of the fourth winding and a sixth section of the second part are positioned within the second area of the same plane, the fourth sections, the fifth sections and the sixth section are parallel, and the fifth sections are positioned adjacent to two sides of the sixth section and adjacent inner sides of the fourth sections.

8. The transformer of claim 1, wherein the first winding, the second winding and the first part of the fifth winding are positioned on three different parallel planes, the third winding, the fourth winding and the second part of the fifth winding are positioned on three different parallel planes, the first part of the fifth winding is magnetically isolated from the first winding by at least a first conductor, and the second part of the fifth winding is magnetically isolated from the third winding by at least a second conductor.

9. The transformer of claim 8, wherein the second winding and the at least a first conductor are positioned on a same plane, and the fourth winding and the at least a second conductor are positioned on a same plane.

10. The transformer of claim 9, wherein the at least a first conductor and/or the at least a second conductor is grounded.

11. The transformer of claim 9, wherein the at least a first conductor comprises two first conductors respectively positioned adjacent to an outer side and an inner side of the second winding, and the at least a second conductor comprises two second conductors respectively positioned adjacent to an outer side and an inner side of the fourth winding.

12. A transformer, comprising:
a first winding;
a second winding;
a third winding;
a fourth winding; and
a fifth winding comprising a first part and a second part serially connected to the first part, the first part being magnetically coupled to the second winding and magnetically isolated from the first winding, and the second part being magnetically coupled to the fourth winding and magnetically isolated from the third winding;

wherein the second winding is positioned between the first winding and the first part, the first winding is positioned adjacent to the second winding, and the second winding is positioned adjacent to the first part;

wherein the fourth winding is positioned between the third winding and the second part, the third winding is positioned adjacent to the fourth winding, and the fourth winding is positioned adjacent to the second part;

wherein the transformer is coupled to a first amplifier, a second amplifier, a third amplifier, and a fourth amplifier;

wherein an output end of a first amplifier is coupled to an end of the first winding, and the first amplifier operates according to a first enable signal so as to output a first input signal to the first winding;

wherein an output end of a second amplifier is coupled to an end of the second winding, and the second amplifier operates according to a second enable signal so as to output a second input signal to the second winding;

wherein an output end of a third amplifier is coupled to an end of the third winding, and the third amplifier operates according to a third enable signal so as to output a third input signal to the third winding; and wherein an output end of a fourth amplifier is coupled to an end of the fourth winding, and the fourth amplifier operates according to a fourth enable signal so as to output a fourth input signal to the fourth winding;

wherein a first equivalent inductance of the first winding is less than a second equivalent inductance of the second winding, the second equivalent inductance of the second winding is less than a fifth equivalent inductance of the first part of the fifth winding, a third equivalent inductance of the third winding is less than a fourth equivalent inductance of the fourth winding, the fourth equivalent inductance of the fourth winding is less than a sixth equivalent inductance of the second part of the fifth winding, an output power of the second amplifier is less than an output power of the first amplifier, and an output power of the fourth amplifier is less than an output power of the third amplifier.

* * * * *